US005650020A

United States Patent [19]

Ohta et al.

[11] Patent Number: 5,650,020
[45] Date of Patent: Jul. 22, 1997

[54] COLORED SOLDERED COMPOSITION

[75] Inventors: Kazuchika Ohta, No.15-4, 1-Chome, Tokiiri, Ueda City, Nagano Pref.; Tsuyoshi Komatsu, Okaya, both of Japan

[73] Assignees: Eastern Co., Ltd., Chino; Tadashi Utsunomiya, Okaya; Kazuchika Ohta, Ueda, all of Japan

[21] Appl. No.: 340,735

[22] Filed: Nov. 16, 1994

[30] Foreign Application Priority Data

Jun. 3, 1994 [JP] Japan ................. 6-144134

[51] Int. Cl.$^6$ ................. B23K 35/34
[52] U.S. Cl. ................. 148/24; 148/26; 228/248.1
[58] Field of Search ................. 148/23–26; 228/248.1

[56] References Cited

U.S. PATENT DOCUMENTS

| | | | |
|---|---|---|---|
| 4,670,067 | 6/1987 | Suzuki | 148/26 |
| 4,670,298 | 6/1987 | Lucas et al. | 148/23 |
| 4,901,909 | 2/1990 | George | 148/26 |
| 4,911,764 | 3/1990 | Farnsworth | 148/26 |
| 5,308,407 | 5/1994 | Bishel | 148/23 |

*Primary Examiner*—Melvyn Andrews
*Attorney, Agent, or Firm*—Dilworth & Barrese

[57] ABSTRACT

The present invention relates to a method of infusing coloration in solder to facilitate inspection of soldered portions in the production of electronic machinery, equipment and apparatus, and further, a method of forming a colored membrane on the surface of the soldered portions by employing colored solder materials.

Physically and chemically stable colored powders composed of rare earth compounds or metallic fluoride compounds, having properties of specific gravity lighter than that of solder and further being indecomposable even at a temperature higher than that of the melting points of solders, are mixed into flux. After soldering by employing solder cream containing the mixture, a colored membrane or layer may be formed on the surface of soldered portions by deposition of the colored powder compounds.

14 Claims, No Drawings

COLORED SOLDERED COMPOSITION

BACKGROUND OF THE INVENTION

The present invention relates to colored solder materials and a method of forming a colored membrane on soldered portions by employing said materials. More particularly the invention relates to colored solder materials and a method of forming a colored membrane on the surface of soldered portions by employing said materials to facilitate visual inspection of the soldered portions in the production of electronic machinery, equipment and apparatus.

Hitherto, only solder with natural metallic coloration and sheen have been known. In surface mounting of electronic components on printed wiring boards, reflow soldering is carried out by employing solder cream or paste. After solidification of the solder, it is necessary to inspect the appearance of the solder configuration or fillet, etc. The above inspection has hitherto been carried out either by visual inspection or by employing an automatic optical inspection apparatus.

However, there are many difficulties in effectively carrying out such visual inspections, such as metallic glare and difficulty in discerning between the component leads and the solder. Furthermore, the automatic optical inspection apparatus sometimes indicated wrong inspection results due to halation, etc., ascribable to the metallic glare of the soldered portions.

SUMMARY OF THE INVENTION

With the above in mind, it is the object of the present invention to provide colored solder materials and a method of using said materials to form a colored membrane on soldered areas in order to carry out the appearance inspection of said soldered portions effectively and easily without adversely affecting the properties of the solder.

It is proposed that forming a colored membrane or layer on the surface of the solder is an effective way of facilitating the appearance inspection of soldered joints. Further, the addition of such coloration materials or powders will not interfere with the physical and mechanical properties of the solder or impair solderability. Moreover, the addition of the coloration materials described hereafter prevents solder defects such as solder ball and solder bridge.

It is proposed that when colored powders as previously described are mixed into the solder preflux cream, upon fusing the solder the coloration is squeezed out onto the surface of the fillet and being specific gravity lighter than that of solder, forming a colored layer or membrane on the solder surface.

The colored powder compounds employed in the present invention were selected on the following conditions:

1) The compounds should be able to endure and remain stable at temperatures exceeding the reflow and melting points of solder;

2) The compounds should have chemical stability in order to mix with organic acids such as flux, etc.;

3) The compounds should have specific gravity lighter than that of solder materials so as to migrate to the surface during fusing or melting of the solder;

4) The compounds should have the property of neither generating hydrolysis nor decomposing at the time of heating, and 5) The compounds should have coloration that is easily discernable by visual inspection.

Under consideration of the aforementioned conditions, it has been found that rare earth compounds and metallic fluoride compounds are suitable for said conditions. In particular, rare earth hexaborate compounds (the elements from lanthanum to lutetium and yttrium of the rare earth compounds), rare earth oxides such as neodymium oxide, and rare earth trifluoride compounds such as praseodymium or neodymium, etc., are preferable.

Furthermore, it is possible to mix 0.1–20 wt./% of colored powder compounds into solder cream containing 10 wt./% of flux. Preferably, about 10 wt./% of said compounds are mixed thereinto to achieve a deep color and enhance the printing property onto printed wiring boards.

For example, hexaborate lanthanum is a chemically stable compound with blue color which does not oxidize when heated to temperatures lower than 1000° C. When said hexaborate lanthanum was mixed with solder cream and heated, the mixture formed on the solder surface along with flux, forming a colored membrane thereon after solidification the soldering.

Furthermore, some of the rare earth compounds have fluorescent properties when exposed to ultraviolet rays. In particular, rare earth oxides such as neodymium oxide, or rare earth compounds activated by rare earth ions have the aforementioned property. When those compounds are employed so as to form a deposition membrane on the surface of the soldered portion, fluorescence is emitted only from the soldered portion through the irradiation of ultraviolet rays, making it possible to utilize the fluorescent image thus formed for appearance inspection.

For example, neodymium oxide is a fluorescent compound with blue color. A deposition membrane formed by employing said compound enables carrying out optical appearance inspection effectively by utilizing either reflected light or fluorescence.

A membrane formed by the aforementioned method according to the present invention prevents metallic sheen and further, facilitates visual inspection because said membrane has an easily discernable very vivid, deep blue color. In particular, the boundary between the lead portions of an electronic component and the soldered portion can be clearly discerned due to the coloration, facilitating the visual inspection of the solder fillet configuration.

The invention relates to colored solder materials wherein physically and chemically stable colored powder compounds having the properties of specific gravity lighter than that of solder, and being indecomposable even at a temperatures higher than that of the melting points of solders, are mixed into flux.

The invention more specifically relates to colored solder materials wherein rare earth compounds or metallic fluoride compounds are mixed into flux as physically and chemically stable colored powder compounds having specific gravity lighter than that of solder and further being indecomposable at temperatures higher than those of the melting points of solders.

The invention also relates to colored solder materials wherein rare earth compounds having fluorescent property (when exposed to ultraviolet rays) are mixed into flux as physically and chemically stable colored powder compounds having the properties of specific gravity lighter than that of solder and further being indecomposable even at a temperature higher than those of the melting points of solders.

The invention further relates to a method of forming a colored membrane comprised of rare earth compounds or metallic fluoride compounds, which are mixed into flux as physically and chemically stable colored powder compounds having the properties of specific gravity lighter than that of solder, and further being indecomposable at a temperatures higher than those of the melting points of solders, that form a color membrane on the surface of soldered portions by depositing the colored powder compounds contained in the solder cream onto the surface of the solder fillet after solidification of the solder.

According to the method of the present invention, it becomes possible to form a colored membrane on the surface of soldered portions by deposition of colored powder compounds to facilitate the appearance inspection of soldered portions. Particularly, it is possible to discern clearly the boundary between the lead portions of electronic components mounted on the surface of a printed wiring board and the soldered portion. Due to the coloration of said soldered portions, the configuration of the fillet, etc., may easily be discerned visually, and therefore it is effective in determing soldering conditions. Thus, occurrence of halation due to metallic sheen of the soldered portion can be prevented.

Furthermore, when the fluidity of the flux is excessive or the grain size of the solder powders is too small on carrying out reflow soldering, poor solder conditions such as solder ball or solder bridge occur because the solder powders are expelled prior to complete melting. However, when the aforementioned colored powder compounds are mixed into the flux, the solder powders are effectively contained preventing outflow in the form of said solder ball and solder bridge.

DESCRIPTION OF THE PREFERRED EMBODIMENTS

Hereinafter, embodiments of the present invention will be described with reference to the following examples. The present invention, however, is not limited to these examples.

EXAMPLE 1

When hexaborate lanthanum ($LaB_6$) was employed as a colored powder compound:

Approximately 10 grams of hexaborate lanthanum powders (deep indigo blue) with a grain size of 300 mesh or less were added to 100 grams of solder cream (containing 10 wt./% flux) consisting of eutectic solder powders with 300–400 mesh grain and mixed fully in a manner that does not destroy the configuration of the solder powders.

The colored solder cream thus obtained was printed onto the land of a printed wiring board and reflow soldering was carried out at a temperature of 220° C. after mounting a chip component thereon. After solidification of the soldering, a deposition membrane consisting of hexaborate lanthanum and flux was formed on the surface of the soldered portion. Said deposition membrane appeared as a very deep and vivid purple color.

EXAMPLE 2

When neodymium oxide ($Nd_2O_3$) was employed as a colored powder compound:

Approximately 10 grams of neodymium oxide (light blue color) were added to 100 grams of solder cream (containing 10 wt./% of flux) consisting of eutectic solder powders with a grain size of 300–400 mesh and mixed fully in a manner that does not destroy the configuration of the solder powders.

The colored solder cream thus obtained was printed onto the land of a printed wiring board and reflow soldering was carried out at a temperature of 220° C. After solidification of the solder, a light blue deposition membrane consisting of neodymium oxide and flux was formed on the surface of the soldered portion. Said deposition membrane had the characteristic of a clear and distinctive outline when exposed to ultraviolet rays.

EXAMPLE 3

When neodymium fluoride ($NdF_3$) was employed as a colored powder compound:

Approximately 10 grams of neodymium fluoride (light purple color) were added to 100 grams of solder cream (containing 10 wt./% of flux) consisting of eutectic solder powders with a grain size of 300–400 mesh and mixed fully in a manner that does not destroy the configuration of the solder powders.

The colored solder cream thus obtained was printed onto the land of a printed wiring board and reflow soldering was carried out at a temperature of 220° C. After solidification of the solder, a thin deposition membrane with a pearlescent white color consisting of neodymium fluoride and flux was formed on the surface of the soldered portion. Said deposition membrane had the effect of preventing metallic sheen on the surface of the soldered portion.

According to the present invention, since the colored powder compounds included in solder cream are deposited onto the surface of the soldered portions forming a deposition membrane, occurrence of halation due to metallic sheen can be prevented, thereby enabling the carrying out of accurate appearance inspection either by visual inspection or by automatic optical inspection apparatus.

The accurate carrying out of appearance inspections as afforded by application of the present invention improves the reliability of solder wettability inspection. Furthermore, the addition of said coloration powders prevents the occurence of solder ball and solder bridge, and protects the soldered portions from environmental conditions due to the formation of a surface membrane.

What is claimed is:

1. Colored soldering composition, comprising solder, flux, and a colored powder compound, said compound being physically and chemically stable, having a specific gravity lighter than specific gravity of said solder and being indecomposable at a temperature above melting point of said solder, wherein said colored powder compound is selected from the group consisting of rare earth compounds, metallic fluoride compounds and mixtures thereof.

2. The composition of claim 1, wherein said colored powder compound is mixed into said flux.

3. The composition of claim 1, wherein said solder, flux and colored powder compound are mixed together such that upon fusing or melting of said solder, a colored membrane is formed upon a surface of said solder.

4. The composition of claim 3, wherein said membrane is composed of said colored powder compound and flux.

5. The composition of claim 1, wherein said colored powder compound is selected from the group consisting of rare earth hexaborate compounds, rare earth oxides, rare earth trifluoride compounds and mixtures thereof.

6. The composition of claim 5, wherein said colored powder compound is selected from the group consisting of one of La-Lu hexaborate in the Lathanide series, yttrium hexaborate, neodymium oxide, praseodymium trifluoride, neodymium trifluoride and mixtures thereof.

7. The composition of claim 6, wherein said colored compound is one of $LaB_6$, $Nd_2O_3$ or $NdF_3$.

8. The composition of claim 1, wherein said colored powder compound is a fluorescent rare earth compound.

9. The compound of claim 8, wherein said rare earth compound exhibits fluorescence when exposed to ultraviolet rays.

10. The composition of claim 1, wherein 0.1–20 weight % of said colored powder compound is mixed into solder cream containing about 10 weight % of said flux.

11. The composition of claim 10, wherein about 10 weight % of said colored compound is mixed into the solder cream to achieve a deep color and enhance printing property onto printed wiring boards.

12. The composition of claim 1, wherein said solder is principally composed of tin-lead alloy.

13. Colored soldering composition for soldering of electronic components, comprising solder flux, and a colored powdered compound, said compound being physically and chemically stable, having a specific gravity lighter than specific gravity of said solder and being indecomposable at a temperature above melting point of said solder, wherein said colored powder compound is selected from the group consisting of rare earth compounds, metallic fluoride compounds and mixtures thereof, said solder, flux and colored powder compound are mixed together such that upon fusing or melting of said solder, a colored membrane is formed upon a surface of said solder, solder powders are contained within the composition, preventing outflow in the form of soldering defects and visual inspection of the electronic components soldered to a printed wiring board can be effectively and easily carried out without adversely affecting the properties of the solder.

14. The composition of claim 13, wherein said colored membrane prevents metallic sheen, facilitates visual inspection by forming an easily discernable, vivid, deep the color, and provides for clear discerning of a boundary between lead portions of the electronic components and soldered portion due to the coloration, thereby facilitating the visual inspection of a solder fillet configuration.

* * * * *